(12) United States Patent
Guo et al.

(10) Patent No.: US 10,269,440 B2
(45) Date of Patent: Apr. 23, 2019

(54) FLASH MEMORY ARRAY WITH INDIVIDUAL MEMORY CELL READ, PROGRAM AND ERASE

(71) Applicants: Silicon Storage Technology, Inc., San Jose, CA (US); The Regents of the University of California, Oakland, CA (US)

(72) Inventors: Xinjie Guo, Goleta, CA (US); Farnood Merrikh Bayat, Goleta, CA (US); Dmitri Strukov, Goleta, CA (US); Nhan Do, Saratoga, CA (US); Hieu Van Tran, San Jose, CA (US); Vipin Tiwari, Dublin, CA (US)

(73) Assignees: Silicon Storage Technology, Inc., San Jose, CA (US); The Regents Of The University Of California, Oakland, CA (US)

( * ) Notice: Subject to any disclaimer, the term of this patent is extended or adjusted under 35 U.S.C. 154(b) by 76 days.

(21) Appl. No.: 15/374,588

(22) Filed: Dec. 9, 2016

(65) Prior Publication Data

US 2017/0337980 A1 Nov. 23, 2017

Related U.S. Application Data

(60) Provisional application No. 62/337,751, filed on May 17, 2016.

(51) Int. Cl.
| | |
|---|---|
| *G11C 16/14* | (2006.01) |
| *G11C 16/34* | (2006.01) |
| *G11C 16/10* | (2006.01) |
| *G11C 16/26* | (2006.01) |
| *H01L 27/11521* | (2017.01) |
| *H01L 27/11558* | (2017.01) |
| *G11C 7/18* | (2006.01) |

(Continued)

(52) U.S. Cl.
CPC .......... *G11C 16/3431* (2013.01); *G11C 7/18* (2013.01); *G11C 8/14* (2013.01); *G11C 16/0483* (2013.01);
(Continued)

(58) Field of Classification Search
CPC .......... G11C 16/14; G11C 16/04; G11C 5/06; H01L 27/115
(Continued)

(56) References Cited

U.S. PATENT DOCUMENTS

| | | |
|---|---|---|
| 5,029,130 A | 7/1991 | Yeh |
| 5,138,576 A | 8/1992 | Madurawe |

(Continued)

FOREIGN PATENT DOCUMENTS

EP 0562737 B1 6/1998

*Primary Examiner* — Jason Lappas
(74) *Attorney, Agent, or Firm* — DLA Piper LLP (US)

(57) ABSTRACT

A memory device that provides individual memory cell read, write and erase. In an array of memory cells arranged in rows and columns, each column of memory cells includes a column bit line, a first column control gate line for even row cells and a second column control gate line for odd row cells. Each row of memory cells includes a row source line. In another embodiment, each column of memory cells includes a column bit line and a column source line. Each row of memory cells includes a row control gate line. In yet another embodiment, each column of memory cells includes a column bit line and a column erase gate line. Each row of memory cells includes a row source line, a row control gate line, and a row select gate line.

7 Claims, 7 Drawing Sheets

(51) Int. Cl.
 *G11C 8/14* (2006.01)
 *G11C 16/04* (2006.01)
 *H01L 29/788* (2006.01)
 *H01L 27/11524* (2017.01)

(52) U.S. Cl.
 CPC .............. *G11C 16/10* (2013.01); *G11C 16/14* (2013.01); *G11C 16/26* (2013.01); *G11C 16/3427* (2013.01); *H01L 27/11521* (2013.01); *H01L 27/11524* (2013.01); *H01L 27/11558* (2013.01); *H01L 29/7881* (2013.01)

(58) Field of Classification Search
 USPC .................................................... 365/185.29
 See application file for complete search history.

(56) References Cited

U.S. PATENT DOCUMENTS

| | | |
|---|---|---|
| 5,146,602 A | 9/1992 | Holler |
| 5,256,911 A | 10/1993 | Holler |
| 5,264,734 A | 11/1993 | Holler |
| 5,469,397 A | 11/1995 | Hoshino |
| 5,643,814 A | 7/1997 | Chung |
| 6,747,310 B2 | 6/2004 | Fan et al. |
| 7,315,056 B2 | 1/2008 | Klinger et al. |
| 7,868,375 B2 | 1/2011 | Liu et al. |
| 2003/0034510 A1 | 2/2003 | Liu |
| 2004/0125655 A1 | 7/2004 | Tsai |
| 2005/0087892 A1 | 4/2005 | Hsu |
| 2006/0170038 A1 | 8/2006 | Wong |
| 2007/0171756 A1 | 7/2007 | Lambrache |
| 2010/0290292 A1 | 11/2010 | Tanizaki |
| 2014/0269062 A1 | 9/2014 | Do |
| 2015/0106315 A1 | 4/2015 | Birdwell |
| 2015/0213898 A1* | 7/2015 | Do .................. G11C 5/063 365/185.29 |
| 2015/0262055 A1 | 9/2015 | Akopyan |
| 2016/0042790 A1 | 2/2016 | Tran |
| 2016/0133639 A1 | 5/2016 | Tran |
| 2017/0337466 A1 | 11/2017 | Bayat |
| 2017/0337971 A1 | 11/2017 | Tran et al. |

\* cited by examiner

FLASH MEMORY ARRAY WITH INDIVIDUAL MEMORY CELL READ, PROGRAM AND ERASE

RELATED APPLICATIONS

This application claims the benefit of U.S. Provisional Application No. 62/337,751, filed May 17, 2016, and which is incorporated herein by reference.

FIELD OF THE INVENTION

The present invention relates to non-volatile memory arrays.

BACKGROUND OF THE INVENTION

Split gate non-volatile memory cells, and arrays of such cells, are well known. For example, U.S. Pat. No. 5,029,130 ("the '130 patent") discloses an array of split gate non-volatile memory cells, and is incorporated herein by reference for all purposes. The memory cell is shown in FIG. 1. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 has a first portion 22a that is disposed over and insulated from (and controls the conductivity of) a second portion of the channel region 18, and a second portion 22b that extends up and over the floating gate 20. The floating gate 20 and control gate 22 are insulated from the substrate 12 by a gate oxide 26.

The memory cell is erased (where electrons are removed from the floating gate) by placing a high positive voltage on the control gate 22, which causes electrons on the floating gate 20 to tunnel through the intermediate insulation 24 from the floating gate 20 to the control gate 22 via Fowler-Nordheim tunneling.

The memory cell is programmed (where electrons are placed on the floating gate) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20.

The memory cell is read by placing positive read voltages on the drain 16 and control gate 22 (which turns on the channel region under the control gate). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

The architecture of the memory array is shown in FIG. 2. The memory cells 10 are arranged in rows and columns. In each column, the memory cells are arranged end to end in mirror fashion, so that they are formed as pairs of memory cells each sharing a common source region 14 (S), and each adjacent set of memory cell pairs sharing a common drain region 16 (D). All the source regions 14 for any given row of memory cells are electrically connected together by a source line 14a. All the drain regions 16 for any given column of memory cells are electrically connected together by a bit line 16a. All the control gates 22 for any given row of memory cells are electrically connected together by a control gate line 22a. Therefore, while the memory cells can be individually programmed and read, memory cell erasure is performed row by row (each row of memory cells is erased together, by the application of a high voltage on the control gate line 22a). If a particular memory cell is to be erased, all the memory cells in the same row must also be erased.

Those skilled in the art understand that the source and drain can be interchangeable, where the floating gate can extend partially over the source instead of the drain, as shown in FIG. 3. FIG. 4 best illustrates the corresponding memory cell architecture, including the memory cells 10, the source lines 14a, the bit lines 16a, and the control gate lines 22a. As is evident from the figures, memory cells 10 of the same row share the same source line 14a and the same control gate line 22a, while the drains of all cells of the same column are electrically connected to the same bit line 16a. The array design is optimized for digital applications, and permits individual programming of the selected cells, e.g., by applying 1.6 V and 7.6 V to the selected control gate line 22a and source line 14a, respectively, and grounding the selected bit line 16a. Disturbing the non-selected memory cell in the same pair is avoided by applying a voltage greater than 2 volts on the unselected bit lines 16a and grounding the remaining lines. The memory cells 10 cannot be erased individually because the process responsible for erasure (the Fowler-Nordheim tunneling of electrons from the floating gate 20 to the control gate 22) is only weakly affected by the drain voltage (i.e., the only voltage which may be different for two adjacent cells in the row direction sharing the same source line 14a).

Split gate memory cells having more than two gates are also known. For example, memory cells have source region 14, drain region 16, floating gate 20 over a first portion of channel region 18, a select gate 28 over a second portion of the channel region 18, a control gate 22 over the floating gate 20, and an erase gate 30 over the source region 14 are known, as shown in FIG. 5. Programming is shown by heated electrons from the channel region 18 injecting themselves onto the floating gate 20. Erasing is shown by electrons tunneling from the floating gate 20 to the erase gate 30.

The architecture for a four-gate memory cell array can be configured as shown in FIG. 6. In this embodiment, each horizontal select gate line 28a electrically connects together all the select gates 28 for that row of memory cells. Each horizontal control gate line 22a electrically connects together all the control gates 22 for that row of memory cells. Each horizontal source line 14a electrically connects together all the source regions 14 for two rows of memory cells that share the source regions 14. Each bit line 16a electrically connects together all the drain regions 16 for that column of memory cells. Each erase gate line 30a electrically connects together all the erase gates 30 for two rows of memory cells that share the erase gate 30. As with the previous architecture, individual memory cells can be independently programmed and read. However, there is no way to erase cells individually. Erasing is performed by placing a high positive voltage on the erase gate line 30a, which results in the simultaneous erasing of both rows of the memory cells that share the same erase gate line 30a. Exemplary operating voltages can include those in Table 1 below (in this embodiment, select gate lines 28a can be referred to as word lines WL):

TABLE 1

|  | WL | | BL | | SL | | CG | | EG | |
| --- | --- | --- | --- | --- | --- | --- | --- | --- | --- | --- |
|  | Sel. | Unsel. | Sel. | Unsel. | Sel. | Unsel. | Sel. | Unsel. | Sel. | Unsel. |
| Erase | 0 V | 0 V | 0 V | 0 V | 0 V | 0 V | 0 V | 0 V | 11.5 V | 0 V |
| Read | 2.5 V | 0 V | 0.8 V | 0 V | 0 V | 0 V | 2.5 V | 2.5 V | 0 V | 0 V |
| Program | 1 V | 0 V | 1 μA | 2.5 V | 4.5 V | 0.5 V | 10.5 V | 0/2.5 V | 4.5 V | 0.5 V |

Recently, new applications for split gate non-volatile memory cells have been developed that requires true single bit operation (i.e. each memory cell can be individually programmed, read, and erased, without any interference from or disturbing the programming state of adjacent memory cells). Therefore, there is a need for an array of split gate non-volatile memory cells which can be independently programmed, read and erased.

BRIEF SUMMARY OF THE INVENTION

The aforementioned problems and needs are addressed by a memory device that includes a substrate of semiconductor material, and a plurality of memory cells formed on the substrate and arranged in an array of rows and columns, wherein the rows of the memory cells are arranged in alternating even and odd numbered rows. Each of the memory cells includes spaced apart source and drain regions in the substrate, with a channel region in the substrate extending there between, a floating gate disposed over and insulated from a first portion of the channel region adjacent the source region, and a control gate disposed over and insulated from a second portion of the channel region adjacent the drain region. Each of the rows of memory cells includes a source line that electrically connects together all the source regions for the row of memory cells. Each of the columns of memory cells includes a bit line that electrically connects together all the drain regions for the column of memory cells. Each of the columns of memory cells includes a first control gate line that electrically connects together all the control gates of the memory cells in the column of memory cells that are in the odd numbered rows of the memory cells. Each of the columns of memory cells includes a second control gate line that electrically connects together all the control gates of the memory cells in the column of memory cells that are in the even numbered rows of the memory cells.

A method of erasing the above described memory device includes applying a positive voltage to one of the first or second control gate lines that is electrically connected to the control gate of the selected memory cell, and a ground voltage to all the others of the first and second control gate lines, applying a ground voltage to one of the source lines that is electrically connected to the source region of the selected memory cell, and a positive voltage to all the others of the source lines, and applying a ground voltage to all of the bit lines.

A memory device includes a substrate of semiconductor material, and a plurality of memory cells formed on the substrate and arranged in an array of rows and columns. Each of the memory cells includes spaced apart source and drain regions in the substrate, with a channel region in the substrate extending there between, a floating gate disposed over and insulated from a first portion of the channel region adjacent the source region, and a control gate disposed over and insulated from a second portion of the channel region adjacent the drain region. Each of the columns of memory cells includes a source line that electrically connects together all the source regions for the column of memory cells. Each of the columns of memory cells includes a bit line that electrically connects together all the drain regions for the column of memory cells. Each of the rows of memory cells includes a control gate line that electrically connects together all the control gates for the row of memory cells.

A method of erasing the above described memory device includes applying a positive voltage to one of the control gate lines that is electrically connected to the control gate of the selected memory cell, and a ground voltage to all the others of the control gate lines, applying a ground voltage to one of the source lines that is electrically connected to the source region of the selected memory cell, and a positive voltage to all the others of the source lines, and applying a ground voltage to all of the bit lines.

A memory device includes a substrate of semiconductor material, and a plurality of memory cells formed on the substrate and arranged in an array of rows and columns. Each of the memory cells includes spaced apart source and drain regions in the substrate, with a channel region in the substrate extending there between, a floating gate disposed over and insulated from a first portion of the channel region adjacent the source region, a control gate disposed over and insulated from the floating gate, a select gate disposed over and insulated from a second portion of the channel region adjacent the drain region, and an erase gate disposed over and insulated from the source region. Each of the rows of memory cells includes a source line that electrically connects together all the source regions for the row of memory cells. Each of the columns of memory cells includes a bit line that electrically connects together all the drain regions for the column of memory cells. Each of the rows of memory cells includes a control gate line that electrically connects together all the control gates for the row of memory cells. Each of the rows of memory cells includes a select gate line that electrically connects together all the select gates for the row of memory cells. Each of the columns of memory cells includes an erase gate line that electrically connects together all the erase gates for the column of memory cells.

A method of erasing the above described memory device includes applying a ground voltage to one of the control gate lines that is electrically connected to the control gate of the selected memory cell, and a positive voltage to all the others of the control gate lines, applying a ground voltage to all of the source lines, applying a ground voltage to all of the bit lines, applying a ground voltage to all of the select gate lines, and applying a positive voltage to one of the erase gate lines that is electrically connected to the erase gate of the selected memory cell, and a ground voltage to all the others of the erase gate lines.

Other objects and features of the present invention will become apparent by a review of the specification, claims and appended figures.

DETAILED DESCRIPTION OF THE INVENTION

The present invention involves new architecture configurations for arrays of split-gate non-volatile memory cells that provide unique (random order) programming, reading and erasing of single memory cells (i.e., true single bit operation).

Figure 1:
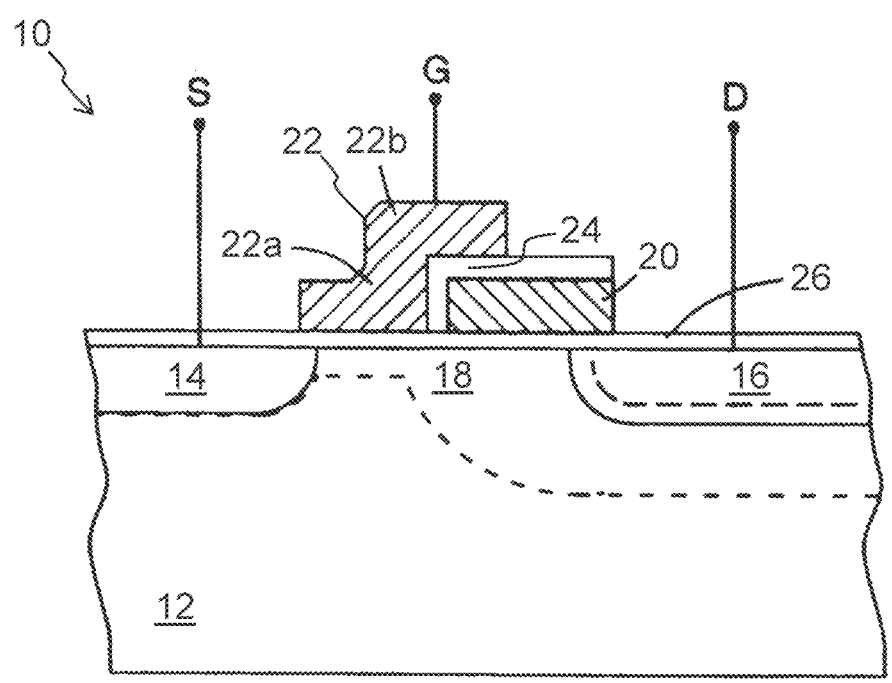
FIG. 1 is a side cross sectional view of a conventional 2-gate non-volatile memory cell.
Figure 2:
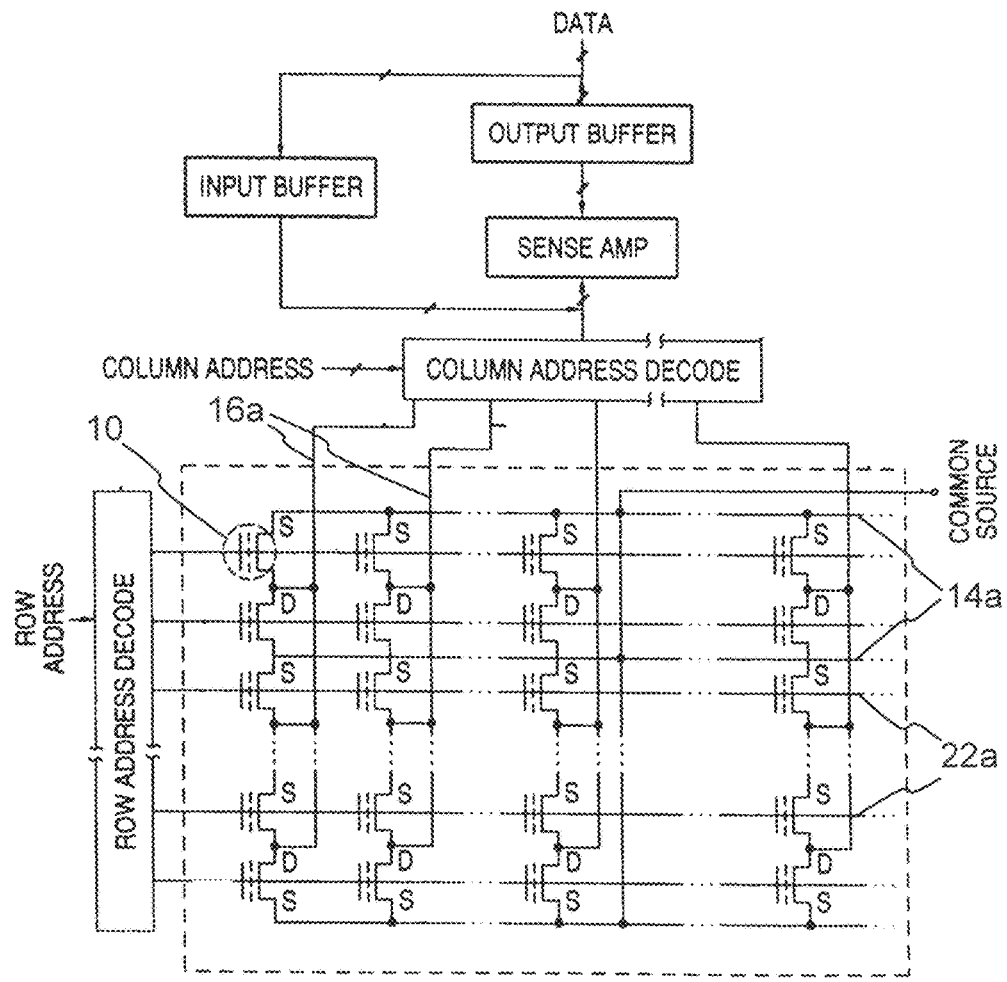
FIG. 2 is a schematic drawing of a conventional architecture of the 2-gate non-volatile memory cell of FIG. 1.
Figure 3:
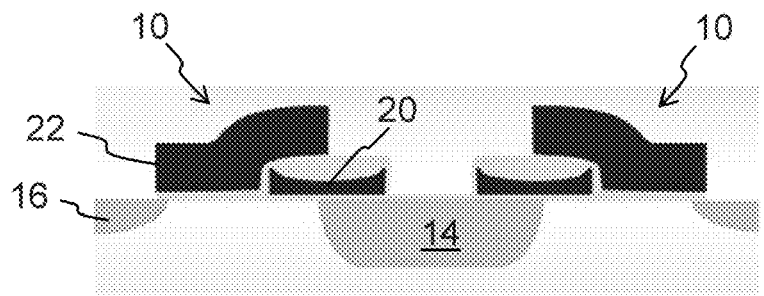
FIG. 3 is a side cross sectional view of a conventional pair of 2-gate non-volatile memory cells.
Figure 4:
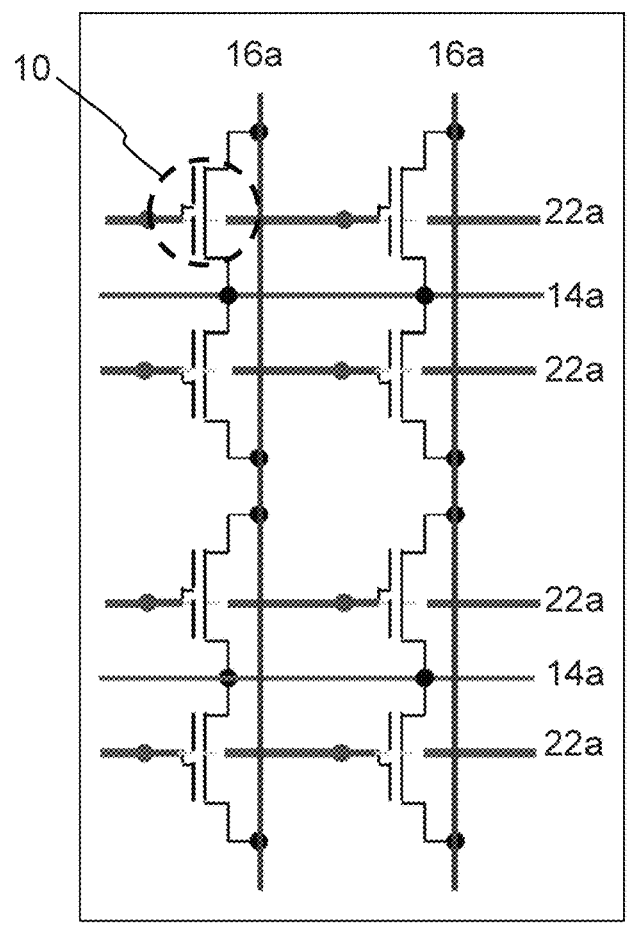
FIG. 4 is a schematic drawing of a conventional architecture of the 2-gate non-volatile memory cells of FIG. 3.
Figure 5:
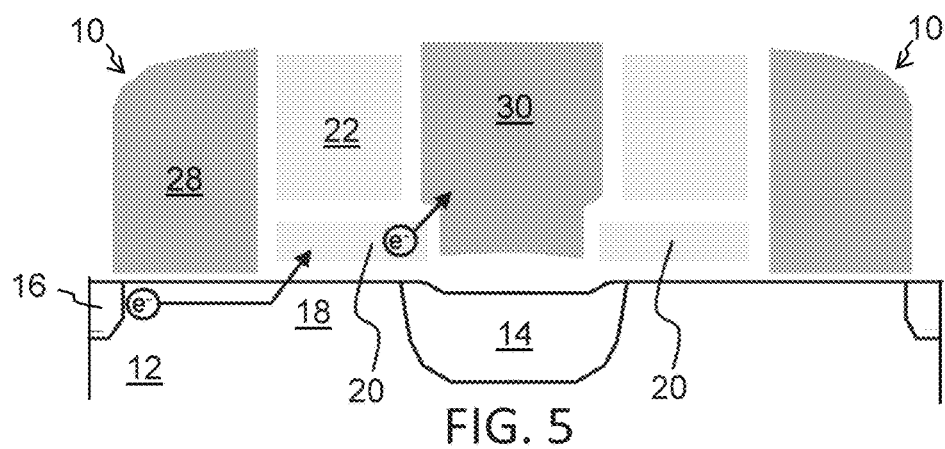
FIG. 5 is a side cross sectional view of a conventional 4-gate non-volatile memory cell.
Figure 7:
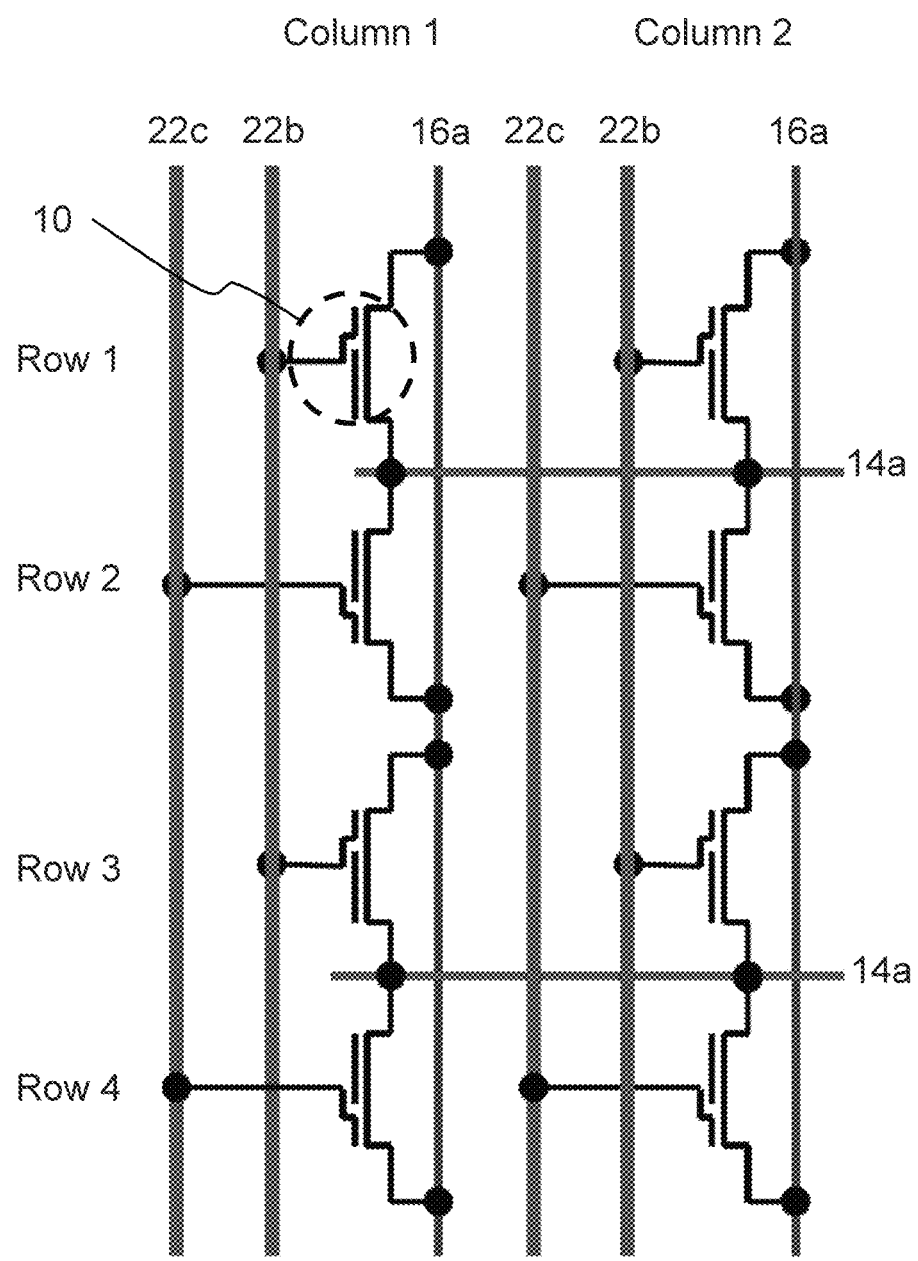
FIG. 7 is a schematic drawing of the 2-gate non-volatile memory cell architecture of the present invention.

For the two-gate cell of FIGS. 1 and 3, the memory cell array architecture that provides true single bit operation is shown in FIG. 7. The main difference between the 2-gate single bit operation architecture of FIG. 7, and the conventional 2-gate architecture discussed above with respect to FIGS. 2 and 4, is that the horizontal control gate lines 22a (one for each row of memory cells) have been replaced with vertical control gate lines 22b and 22c (i.e., two control gate lines for each column of memory cells). Specifically, each column of memory cells includes two control gate lines: a first control gate line 22b electrically connecting together all the control gates 22 of the odd row memory cells (i.e., those memory cells in odd rows 1, 3, 5, etc.), and a second control gate line 22c electrically connecting together all the control gates 22 of the even row memory cells (i.e., those memory cells in even rows 2, 4, 6, etc.). By reorienting the control gate lines in this manner, any memory cell in the array can be individually programmed, erased and read without adversely affecting the memory state of adjacent memory cells. Exemplary (non-limiting) operational voltages to erase, program or read any given target memory cell are shown in Table 2 below:

TABLE 2

| | CG 22 | | Drain 16 | | Source 14 | |
| --- | --- | --- | --- | --- | --- | --- |
| | sel | unsel | sel | unsel | sel | unsel |
| Erase | VGerase | gnd | gnd | gnd | gnd | VSerinhibit |
| Program | VGprg | gnd | Iprog | VDprginh | VSprg | gnd |
| Read | VGrd | gnd | VDrd | gnd | VSrd | float/gnd |

(sel = line that intersects target memory cell)
(unsel = line that does not intersect target memory cell).

Numerical (non-limiting) examples are shown in Table 3 below:

TABLE 3

| VGerase | 5-9 v |
| --- | --- |
| VSerinhibit | 3-4 v |
| VGprg | 1.2-1.7 v |
| VDprginh | 1.5-2.5 v |
| Iprog | 2-5 ua |
| VSprg | 4-8 V |
| VGrd | 0.4-2.5 V |
| VDrd | 1-2 V |
| VSrd | 0-0.6 V |

During erase, only the selected cell will have a high voltage on its control gate 22 in combination with its source region 14 being at ground, so that electrons will tunnel off the floating gate 20. Any unselected cells in the same column that have a high voltage applied to their control gates 22 will also have an inhibit voltage applied to their source regions 14 that is sufficiently high to inhibit any tunneling of electrons off of the floating gate (i.e. the electrons will see positive voltages in two opposing directions).

Figure 8:
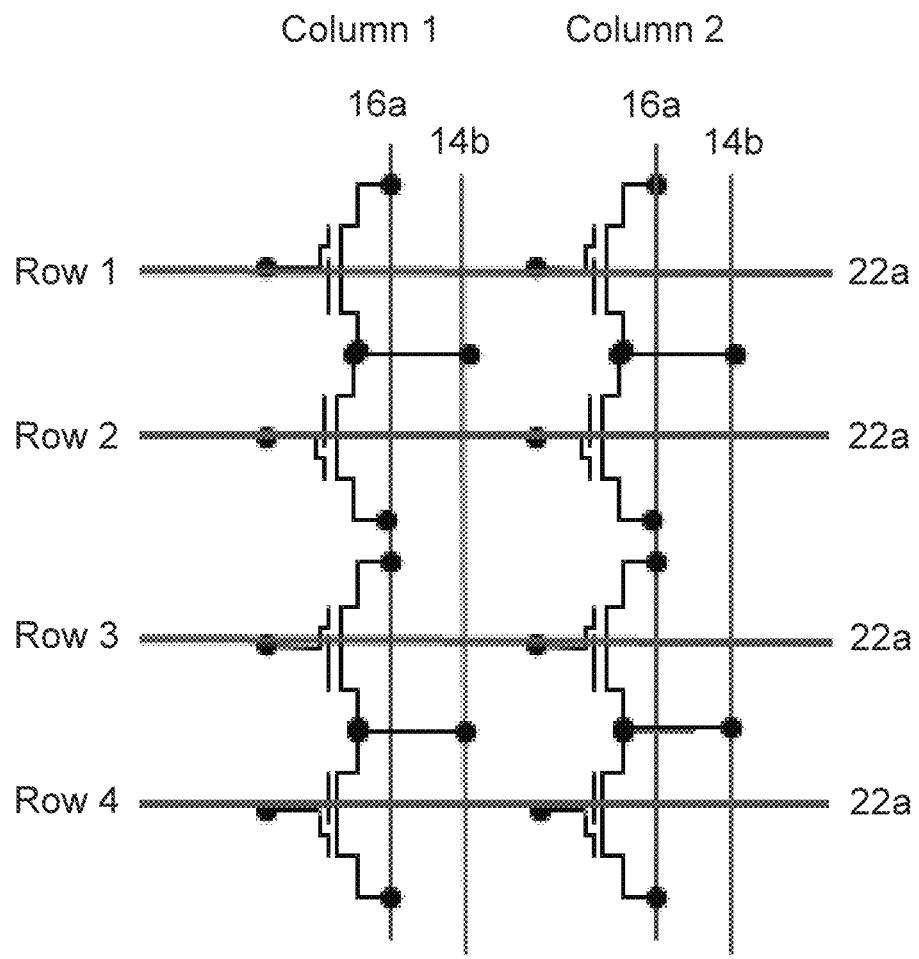
FIG. 8 is a schematic drawing of an alternate embodiment of the 2-gate non-volatile memory cell architecture of the present invention.

FIG. 8 illustrates an alternate embodiment of the 2-gate single bit operation architecture. The main difference between the 2-gate single bit operation architecture of FIG. 8, and the conventional 2-gate architecture discussed above with respect to FIGS. 2 and 4, is that the horizontal source lines 14a (one for each row) have been replaced with vertical source lines 14b (one for each column). Specifically, each column of memory cells includes a source line 14b electrically connecting together all the source regions 14 for all the memory cells 10 in that column. By reorienting the source lines in this manner, any memory cell in the array can be individually programmed, erased and read without adversely affecting the memory state of adjacent memory cells. The Table 2 operational values equally apply to this embodiment.

Figure 6:
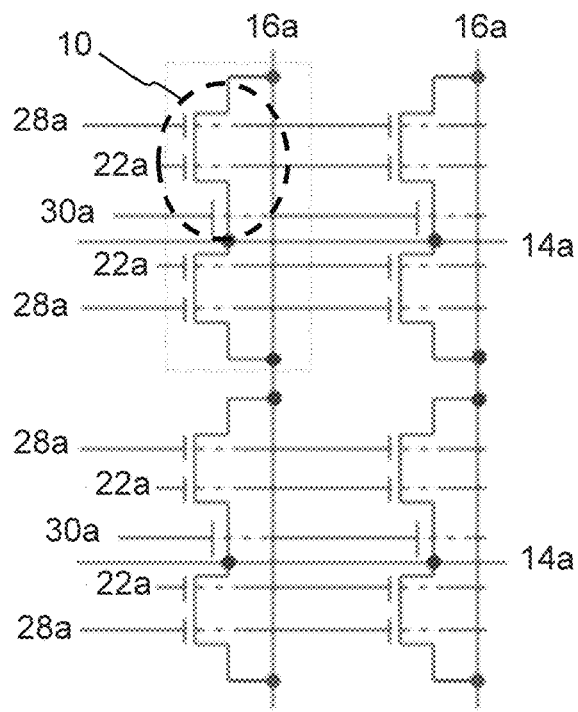
FIG. 6 is a schematic drawing of a conventional architecture of the 4-gate non-volatile memory cell of FIG. 5.
Figure 9:
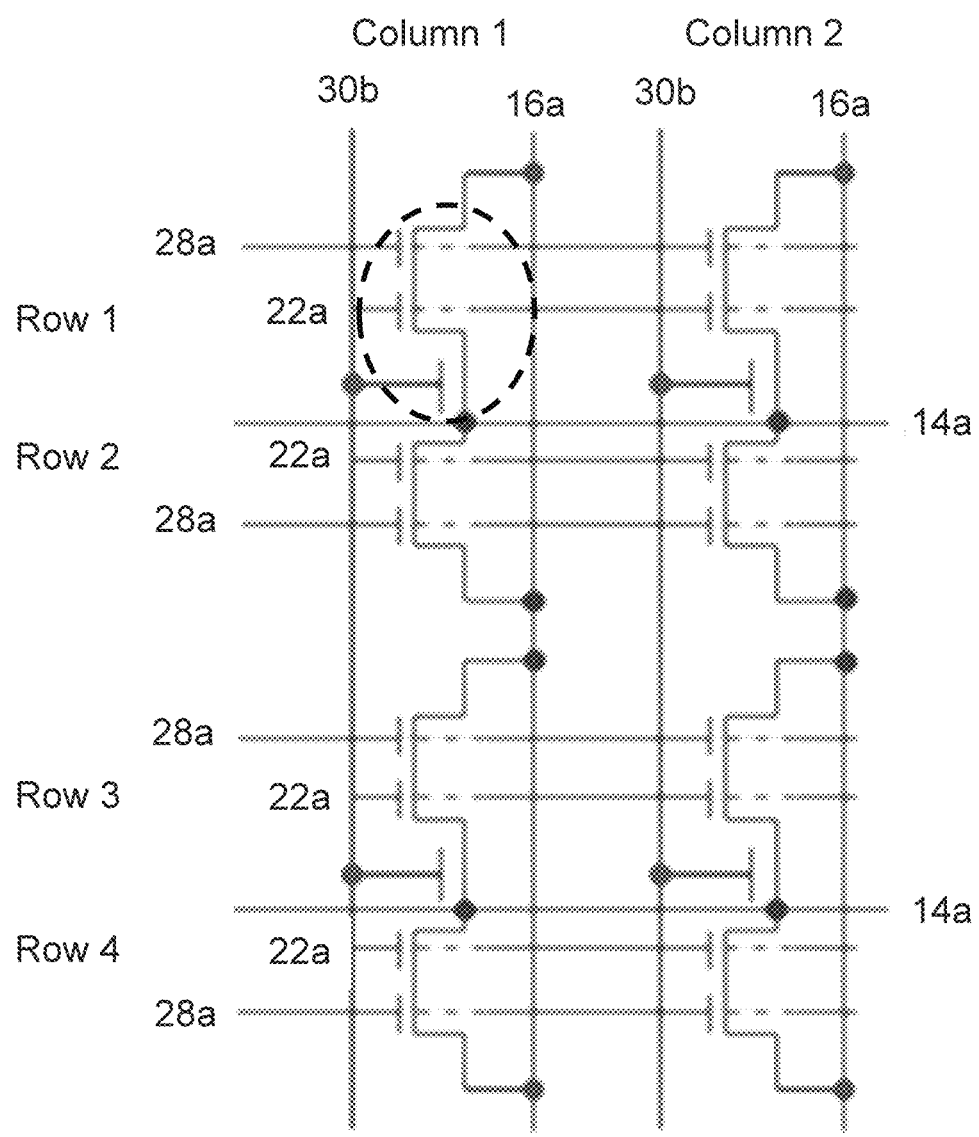
FIG. 9 is a schematic drawing of the 4-gate non-volatile memory cell architecture of the present invention.

FIG. 9 illustrates a 4-gate single bit operation architecture for the memory cell of FIG. 6. The main difference between the 4-gate single bit operation architecture of FIG. 9, and the conventional 4-gate architecture discussed above with respect to FIG. 6, is that the horizontal erase gate lines 30a (one for each pair of memory cell pairs) have been replaced with vertical erase gate lines 30b. Specifically, each column of memory cells includes an erase gate line 30b that electrically connects together all the erase gates 30 for the column of memory cells. By reorienting the erase gate lines in this manner, any memory cell in the array can be individually programmed, erased and read. Exemplary operational voltages to erase, program or read any given target memory cell are shown in Table 4 below:

TABLE 4

| | EG | | WL | | CG | | BL | | S | |
|---|---|---|---|---|---|---|---|---|---|---|
| | sel | unsel | sel | unsel | sel | unsel | sel | unsel | sel | unsel |
| Erase | VEGerase | gnd | gnd | gnd | gnd | VCGerinhibit | gnd | gnd | gnd | gnd |
| Program | VEGprg/gnd | gnd | VWLprg | gnd | VCGprg | gnd | Iprog | VBLprginh | VSprg | Float/gnd/0.5 v |
| Read | gnd | gnd | VWLrd | gnd | VCGrd | gnd | VBLrd | gnd | VSrd | float/gnd |

(sel = line that intersects target memory cell)
(unsel = line that does not intersect target memory cell).

Numerical (non-limiting) examples are shown in Table 5 below:

TABLE 5

| | |
|---|---|
| VEGerase | 8-11.5 v |
| VCGerinhibit | 3.5-8 v |
| VEGprg | 4-6 v |
| VWLprg | 0.8-1.2 v |
| VCGprg | 6-10 v |
| VBLprginh | 1-2.5 v |
| Iprog | 0.2-1 ua |
| VSprg | 3-5 V |
| VWLrd | 0.4-2.0 V |
| VCGrd | 1-2.5 V |
| VBLrd | 0.8-2 V |
| VSrd | 0-0.6 V |

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device, comprising:
   a substrate of semiconductor material;
   a plurality of memory cells formed on the substrate and arranged in an array of rows and columns, wherein the rows of the memory cells are arranged in alternating even and odd numbered rows;
   each of the memory cells includes:
      spaced apart source and drain regions in the substrate, with a channel region in the substrate extending there between,
      a floating gate disposed over and insulated from a first portion of the channel region adjacent the source region, and
      a control gate disposed over and insulated from a second portion of the channel region adjacent the drain region;
   each of the rows of memory cells includes a source line that electrically connects together all the source regions for the row of memory cells;
   each of the columns of memory cells includes a bit line that electrically connects together all the drain regions for the column of memory cells;
   each of the columns of memory cells includes a first control gate line that electrically connects together all the control gates of the memory cells in the column of memory cells that are in the odd numbered rows of the memory cells and that is not electrically connected to the control gates of the memory cells in the column of memory cells that are in the even numbered rows of the memory cells; and
   each of the columns of memory cells includes a second control gate line that electrically connects together all the control gates of the memory cells in the column of memory cells that are in the even numbered rows of the memory cells and that is not electrically connected to the control gates of the memory cells in the column of memory cells that are in the odd numbered rows of the memory cells.

2. The memory device of claim 1, wherein for each of the memory cells, the floating gate extends over and is insulated from a portion of the source region.

3. The memory device of claim 1, wherein:
   the memory cells are arranged in pairs of the memory cells; and
   each of the pairs of memory cells shares one of the source regions and one of the source lines.

4. The memory device of claim 1, wherein for each of the memory cells, the control gate comprises a first portion laterally adjacent to the floating gate and a second portion that extends up and over the floating gate.

5. A method of erasing a selected memory cell of a memory device, wherein the memory device comprises:
   a substrate of semiconductor material;
   a plurality of memory cells formed on the substrate and arranged in an array of rows and columns, wherein the rows of the memory cells are arranged in alternating even and odd numbered rows, and wherein one of the plurality of memory cells is a selected memory cell;

each of the memory cells includes:
  spaced apart source and drain regions in the substrate, with a channel region in the substrate extending there between,
  a floating gate disposed over and insulated from a first portion of the channel region adjacent the source region, and
  a control gate disposed over and insulated from a second portion of the channel region adjacent the drain region;

each of the rows of memory cells includes a source line that electrically connects together all the source regions for the row of memory cells;

each of the columns of memory cells includes a bit line that electrically connects together all the drain regions for the column of memory cells;

each of the columns of memory cells includes a first control gate line that electrically connects together all the control gates of the memory cells in the column of memory cells that are in the odd numbered rows of the memory cells and that is not electrically connected to the control gates of the memory cells in the column of memory cells that are in the even numbered rows of the memory cells; and each of the columns of memory cells includes a second control gate line that electrically connects together all the control gates of the memory cells in the column of memory cells that are in the even numbered rows of the memory cells and that is not electrically connected to the control gates of the memory cells in the column of memory cells that are in the odd numbered rows of the memory cells;

the method comprising:
  applying a positive voltage to one of the first or second control gate lines that is electrically connected to the control gate of the selected memory cell, and a ground voltage to all the others of the first and second control gate lines;
  applying a ground voltage to one of the source lines that is electrically connected to the source region of the selected memory cell, and a positive voltage to all the others of the source lines; and
  applying a ground voltage to all of the bit lines.

6. The method of claim 5, wherein the positive voltage applied to the one of the first or second control gate lines is greater than the positive voltage applied to the others of the source lines.

7. The method of claim 5, wherein the positive voltage applied to the one of the first or second control gate lines is at least double than that of the positive voltage applied to the others of the source lines.

* * * * *